US010157947B2

(12) United States Patent
Chen et al.

(10) Patent No.: US 10,157,947 B2
(45) Date of Patent: *Dec. 18, 2018

(54) PHOTONIC LOCK BASED HIGH BANDWIDTH PHOTODETECTOR

(71) Applicant: Artilux, Inc., Zhubei (TW)

(72) Inventors: Shu-Lu Chen, Taipei (TW); Yun-Chung Na, Taipei (TW)

(73) Assignee: Artilux Inc., Zhubei (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/162,521

(22) Filed: May 23, 2016

(65) Prior Publication Data

US 2016/0268328 A1 Sep. 15, 2016

Related U.S. Application Data

(63) Continuation of application No. 14/298,825, filed on Jun. 6, 2014, now Pat. No. 9,362,428, which is a (Continued)

(30) Foreign Application Priority Data

Nov. 27, 2012 (TW) .............................. 101144392 A

(51) Int. Cl.
*H01L 27/14* (2006.01)
*H01L 31/02* (2006.01)
(Continued)

(52) U.S. Cl.
CPC .. *H01L 27/14629* (2013.01); *H01L 27/14643* (2013.01); *H01L 31/0232* (2013.01);
(Continued)

(58) Field of Classification Search
CPC .......... H01S 5/105; H01S 5/183; H01S 5/026; H01S 5/0265; B82Y 20/00; H01L 31/0232; H01L 31/18; H01L 33/105
(Continued)

(56) References Cited

U.S. PATENT DOCUMENTS 3,622,319 A 11/1971 Sharp et al.
4,592,043 A 5/1986 Williams
(Continued)

FOREIGN PATENT DOCUMENTS

CN 1652326 A 8/2005
CN 1780004 A 5/2006
(Continued)

OTHER PUBLICATIONS

Ünlü and Strite, "Resonant cavity enhanced photonic devices", 1995, American Institute of Physics, J. Appl. Phys. 78 (2), pp. 607-639.*
(Continued)

*Primary Examiner* — David Porta
*Assistant Examiner* — Blake Riddick
(74) *Attorney, Agent, or Firm* — Perkins Coie LLP

(57) ABSTRACT

The technique introduced herein decouples the traditional relationship between bandwidth and responsivity, thereby providing a more flexible and wider photodetector design space. In certain embodiments of the technique introduced here, a photodetector device includes a first mirror, a second mirror, and a light absorption region positioned between the first and second reflective mirrors. For example, the first mirror can be a partial mirror, and the second mirror can be a high-reflectivity mirror. The light absorption region is positioned to absorb incident light that is passed through the first mirror and reflected between the first and second mirrors. The first mirror can be configured to exhibit a reflectivity that causes an amount of light energy that escapes from the first mirror, after the light being reflected back by the second mirror, to be zero or near zero.

20 Claims, 16 Drawing Sheets

Related U.S. Application Data continuation-in-part of application No. 13/709,209, filed on Dec. 10, 2012, now abandoned.

(60) Provisional application No. 61/929,112, filed on Jan. 19, 2014, provisional application No. 61/921,412, filed on Dec. 28, 2013.

(51) Int. Cl.

| | | |
|---|---|---|
| H01L 31/10 | (2006.01) | |
| H01L 31/18 | (2006.01) | |
| H01L 27/146 | (2006.01) | |
| H01L 31/0232 | (2014.01) | |
| H01L 31/102 | (2006.01) | |

(52) U.S. Cl.
CPC ...... *H01L 31/02327* (2013.01); *H01L 31/102* (2013.01); *H01L 31/18* (2013.01)

(58) Field of Classification Search
USPC ....... 250/336.1, 214.1, 214 R; 257/432, 414, 257/431, 436, 437; 385/14
See application file for complete search history.

(56) References Cited

U.S. PATENT DOCUMENTS

| | | | |
|---|---|---|---|
| 5,291,055 A * | 3/1994 | Farhoomand | G01J 3/0259 |
| | | | 250/370.14 |
| 5,315,128 A | 5/1994 | Hunt et al. | |
| 5,343,542 A | 8/1994 | Kash et al. | |
| 5,355,216 A | 10/1994 | Kim et al. | |
| 5,389,797 A | 2/1995 | Bryan et al. | |
| 5,455,421 A | 10/1995 | Spears | |
| 5,525,828 A | 6/1996 | Bassous et al. | |
| 5,783,364 A | 7/1998 | Ellis et al. | |
| 6,218,719 B1 | 4/2001 | Tsang et al. | |
| 6,349,106 B1 | 2/2002 | Coldren et al. | |
| 6,836,574 B2 | 12/2004 | Yamada et al. | |
| 7,446,297 B1 | 11/2008 | Sigel et al. | |
| 7,535,944 B1 | 5/2009 | Guilfoyle et al. | |
| 8,058,549 B2 | 11/2011 | Khazeni et al. | |
| 8,330,956 B1 | 12/2012 | Seletskiy et al. | |
| 2003/0047752 A1 | 3/2003 | Campbell et al. | |
| 2003/0231683 A1 | 12/2003 | Chua et al. | |
| 2004/0096574 A1* | 5/2004 | Hsieh | H01S 5/125 |
| | | | 427/126.1 |
| 2005/0002604 A1 | 1/2005 | Verbrugge et al. | |
| 2005/0226294 A1 | 10/2005 | Ledentsov et al. | |
| 2006/0013591 A1 | 1/2006 | Rohde et al. | |
| 2007/0019917 A1 | 1/2007 | Bayindir et al. | |
| 2007/0041414 A1 | 2/2007 | Albrecht et al. | |
| 2007/0086018 A1 | 4/2007 | Shih et al. | |
| 2007/0104441 A1 | 5/2007 | Ahn et al. | |
| 2007/0159638 A1 | 7/2007 | Zeng et al. | |
| 2007/0273887 A1* | 11/2007 | Russell | A61M 16/08 |
| | | | 356/450 |
| 2008/0181277 A1* | 7/2008 | Konig | H01S 5/02423 |
| | | | 372/49.01 |
| 2009/0078973 A1 | 3/2009 | Hsu et al. | |
| 2009/0121305 A1 | 5/2009 | Pan et al. | |
| 2009/0273049 A1 | 11/2009 | Fattal et al. | |
| 2010/0006967 A1 | 1/2010 | Ishimura et al. | |
| 2011/0116095 A1 | 5/2011 | Krol et al. | |
| 2011/0120538 A1 | 5/2011 | Lochtefeld et al. | |
| 2012/0018744 A1 | 1/2012 | Dosunmu et al. | |
| 2012/0077680 A1 | 3/2012 | Berggren et al. | |
| 2013/0164892 A1 | 6/2013 | Sugawara | |
| 2014/0090976 A1 | 4/2014 | Rotschild et al. | |
| 2014/0159183 A1 | 6/2014 | Na et al. | |
| 2014/0239301 A1* | 8/2014 | Huang | H01L 31/1075 |
| | | | 257/53 |
| 2014/0246571 A1* | 9/2014 | Li | G01J 1/0407 |
| | | | 250/227.11 |
| 2014/0284450 A1 | 9/2014 | Chen et al. | |

FOREIGN PATENT DOCUMENTS

| | | |
|---|---|---|
| CN | 1812302 A | 8/2006 |
| JP | H11507178 A | 6/1999 |
| JP | 2003504677 A | 2/2003 |
| TW | 201421653 A | 6/2014 |

OTHER PUBLICATIONS

De Stefano, L. et al., Low-cost VLSI-compatible resonant-cavity-enhanced p-i-n in µc-Si operating at the VCSEL wavelengths around 850 nm, 2003, Proc. SPIE vol. 5117, VKSI Circuits and Systems, pp. 428-433.*

Cai, M., "Observation of critical coupling in a fiber taper to a silica-microsphere whispering-gallery mode system," Phys. Rev. Lett. 85(1), 74-77 (2000).

Carline et al.: "Long-wavelength SiGe/Si resonant cavity infrared detector using a bonded silicon-on-oxide reflector," 1996, Applied Physics Letters, vol. 68, pp. 544-546.

Chen, C.-H., et al., "Resonant-cavity-enhanced p-i-n photodiode with a broad quantumefficiency spectrum by use of an anomalous-dispersion mirror," Appl. Opt. 44(29), 6131-6140 (2005).

Colace, L., "Germanium near infrared detector in Silicon on insulator," Appl. Phys. Lett. 91(2), 021107 (2007).

DeRose, C.T., et al.,"Ultra compact 45 GHz CMOS compatible Germanium waveguide photodiode with low dark current," Opt. Express 19(25), 24897-24904 (2011).

Dosunmu, O. I., et al., "High-speed resonant cavity enhanced Ge photodetectors on reflecting Si substrates for 1550-nm operation," IEEE Photon. Technol. Lett. 17(1), 175-177 (2005).

Emsley, M. K., "High-speed resonant-cavity-enhanced Silicon photodetectors on reflecting Silicon-on-insulator substrates," IEEE Photon. Technol. Lett. 14(4), 519-521 (2002).

Extended European Search Report dated Jun. 15, 2015, for European Patent Publication No. 2 889 917 A2, published Jul. 1, 2015, 9 pages.

Extended European Search Report dated Jun. 29, 2015, for European Patent Application No. 14200338.3 filed Dec. 24, 2014, 9 pages.

Feng, D., et al., "High-speed Ge photodetector monolithically integrated with large crosssection Silicon-on-insulator waveguide," Appl. Phys. Lett. 95(26), 261105 (2009).

Joo, J. et al., "High-sensitivity 10 Gbps Ge-on-Si photoreceiver operating at I~1.55 mm," Opt. Express 18(16), 16474-16479 (2010).

Kishino, K., "Resonant cavity-enhanced (RCE) photodetectors," IEEE J. Quantum Electron. 27(8), 2025-2034 (1991).

Klinger, S., et al., "Ge-on-Si p-i-n photodiodes with a 3-Db bandwidth of 49 GHz," IEEE Photon. Technol. Lett. 21(13), 920-922 (2009).

Li et al.: "Si 1-x Ge x/Si resonant-cavity-enhanced photodetectors with a silicon-on-oxide reflector operating near 1.3 µm," 2000, Applied Physics Letters, vol. 77, pp. 157-159.

Michel, J., et al., "High-performance Ge-on-Si photodetectors," Nat. Photonics 4(8), 527-534 (2010).

Morse, M., et al., "Performance of Ge-on-Si p-i-n photodetectors for standard eeceiver modules," IEEE Photon. Technol. Lett. 18(23), 2442-2444 (2006).

Non-Final Office Action dated Jun. 13, 2014, for U.S. Appl. No. 13/709,209, filed Dec. 10, 2012, now abandoned.

Osmond, J., et al., "40 Gb/s surface-illuminated Ge-on-Si photodetectors," Appl. Phys. Lett. 95(15), 151116 (2009).

Rouviere, M., et al.: "Integration of germanium waveguide photodectors for intrachip optical interconnects," Optical Engineering, vol. 44, No. 7, Jul. 18, 2005, pp. 075402-1.

Tseng, C.-K., et al., "Selfaligned microbonded Ge/Si PIN waveguide photodetector," post-deadline session, 9th IEEE International Conference on Group IV Photonics (GFP), Aug. 29-31, 2012.

U.S. Appl. No. 13/709,209, filed Dec. 10, 2012, now abandoned.

U.S. Appl. No. 14/298,825 by Chen, S., et al., filed Jun. 6, 2014.

Ünlü, M. S., et al., "Resonant Cavity Enhanced Photonic Devices", 1995 American Institute of Physics, J. Appl. Phys. 78 (2), pp. 607-639, Mar. 1, 1995.

(56) References Cited

OTHER PUBLICATIONS

Wu, T.-T., et al., "A critically coupled Germanium photodetector under vertical illumination," Optics express 20, (28) 29338-29346 (2012).
Yariv, A., "Critical coupling and its control in optical waveguide-ring resonator systems," IEEE Photon. Technol. Lett. 14(4), 483-485 (2002).
Yin, T., et al., "31 GHz Ge n-i-p waveguide photodetectors on Silicon-on-Insulator substrate," Opt. Express 15(21), 13965-13971 (2007).
Yu, H., et al., "High-efficiency p-i-n photodetectors on selective-area-grown Ge for monolithic integration," IEEE Electron Device Lett. 30(11), 1161-1163 (2009).
U.S. Appl. No. 14/998,053 by Chen, S., et al., filed Dec. 24, 2015.
Non Final Office Action dated Dec. 31. 2014, for U.S. Appl. No. 14/298,825, of Chen, S.L., filed Jun. 6, 2014.
Final Office Action dated Jun. 9, 2015, for U.S. Appl. No. 14/298,825, of Chen, S.L., filed Jun. 6, 2014.
Notice of Allowance dated Dec. 24, 2015, U.S. Appl. No. 14/298,825, of Chen, S.L., filed Jun. 6, 2014.
Non Final Office Action dated Aug. 11, 2017 for U.S. Appl. No. 14/998,053, of Chen, S.L., filed Dec. 24, 2015.
Non Final Office Action dated May 24, 2018 for U.S. Appl. No. 14/998,053 of Chen et al., filed Dec. 24, 2015; 17 pages.
Kaniewski, J. et al., "Resonant cavity enhanced InGaAs photodiodes for high speed detection of 1.55 um infrared radiation", Proceedings vol. 5783, Infrared Technology and Applications XXXI, 2005; pp. 47-56; SPIE, Bellingham, WA.
Notification of Reasons for Refusal dated Feb. 16, 2018 for Japanese Patent Application No. JP 2014-265530, 6 pages.
Li, Cheng et al., "SiGe/Si resonant-cavity-enhanced photodetectors for 1.3 μm operation fabricated using wafer bonding techniques", Journal of applied physics 92.3, 2002, pp. 1718-1720.

\* cited by examiner

PHOTONIC LOCK BASED HIGH BANDWIDTH PHOTODETECTOR

RELATED APPLICATIONS

This application is a continuation application of U.S. patent application Ser. No. 14/298,825, entitled "PHOTONIC LOCK BASED HIGH BANDWIDTH PHOTODETECTOR," filed on Jun. 6, 2014, issuing as U.S. Pat. No. 9,362,428 on Jun. 7, 2016, which is incorporated by reference herein in its entirety.

The aforementioned U.S. patent application Ser. No. 14/298,825 claims priority to U.S. Provisional Application Nos. 61/929,112, entitled "PHOTONIC LOCK BASED HIGH BANDWIDTH PHOTODETECTOR WITH VARIOUS REFLECTOR DESIGNS," filed Jan. 19, 2014, and 61/921,412 entitled "PHOTONIC LOCK BASED HIGH BANDWIDTH PHOTODETECTOR," filed Dec. 28, 2013; all of which are incorporated by reference herein in their entireties.

The aforementioned U.S. patent application Ser. No. 14/298,825 also claims priority to U.S. patent application Ser. No. 13/709,209, entitled "HIGH-EFFICIENCY BANDWIDTH PRODUCT GERMANIUM PHOTODETECTOR," filed on Dec. 10, 2012, and to Taiwan Patent Application No. 101144392, filed Nov. 27, 2012.

TECHNICAL FIELD

Embodiments of the present disclosure relate to photodetector designs, and more particularly, to photonic lock based high bandwidth photodetectors.

BACKGROUND

With the ever increasing demand for high speed communication, there has been a significant increase in the use of optics in computing systems. Semiconductor photonics, which can be implemented in an integrated circuit with known fabrication techniques, are increasingly deployed to meet the growing use of optics. The resulting semiconductor photodetectors have a small form factor, and their detection bandwidths can be very high. These traits make semiconductor photodetectors suitable for optical fiber based, high-speed telecommunication and datacenter interconnect applications.

However, in conventional photodetector designs, there is an inherent trade-off between responsivity and bandwidth. Traditionally, the responsivity is directly proportional to the path length that the light travels in the light absorption material (e.g., germanium). Considering a conventional normal incidence photodetector as an example, the thicker the absorption layer is, the higher the responsivity is. Unfortunately, a thicker absorption layer almost always features the drawback of longer carrier transit time that reduces the bandwidth of photodetectors.

BRIEF DESCRIPTION OF THE DRAWINGS

One or more embodiments of the present disclosure are illustrated by way of example and not limitation in the figures of the accompanying drawings, in which like references indicate similar elements. These drawings are not necessarily drawn to scale.

DETAILED DESCRIPTION

Figure 1A:
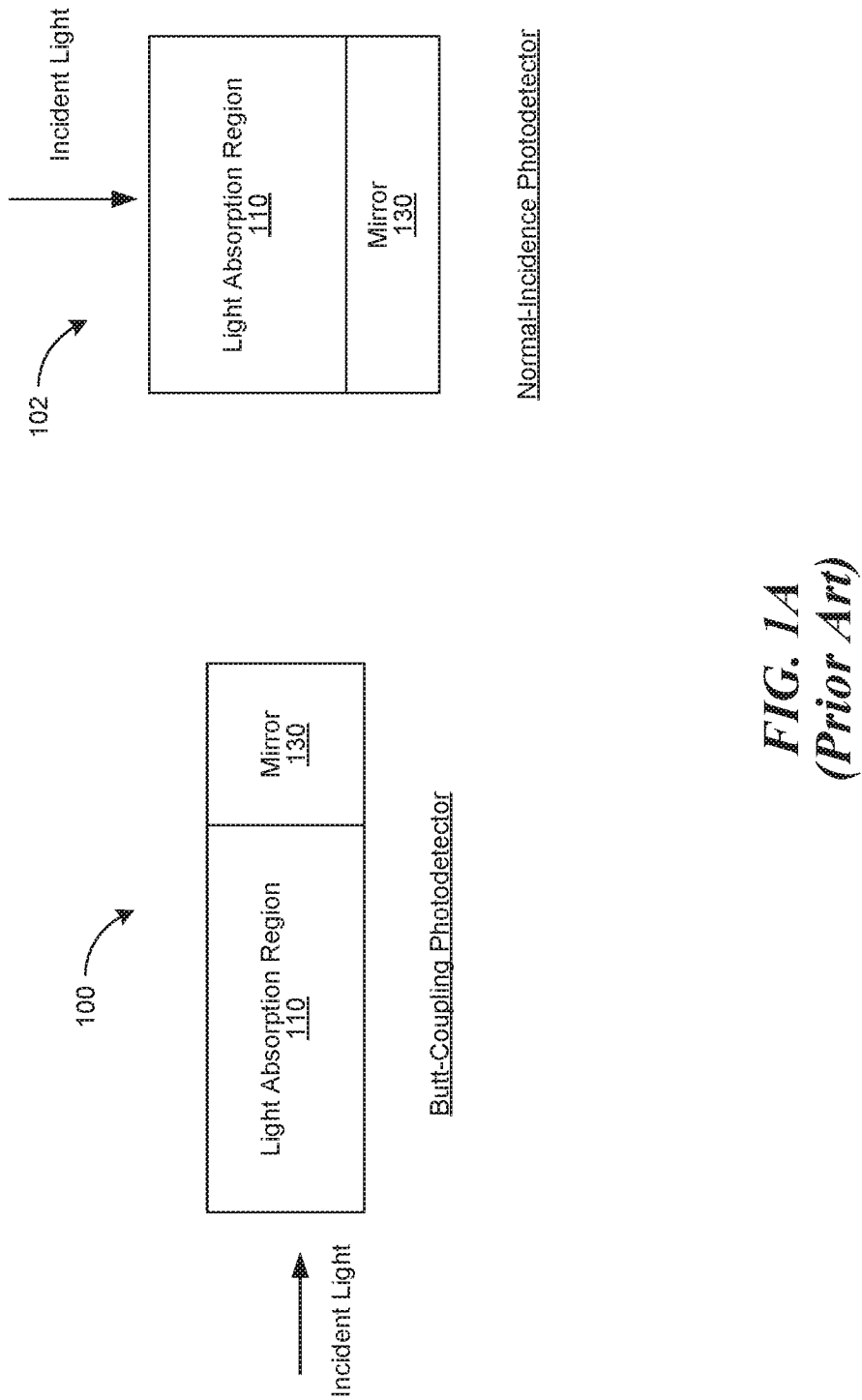
FIGS. 1A-1B illustrate cross-sectional views of conventional photodetector structures.
Figure 1B:
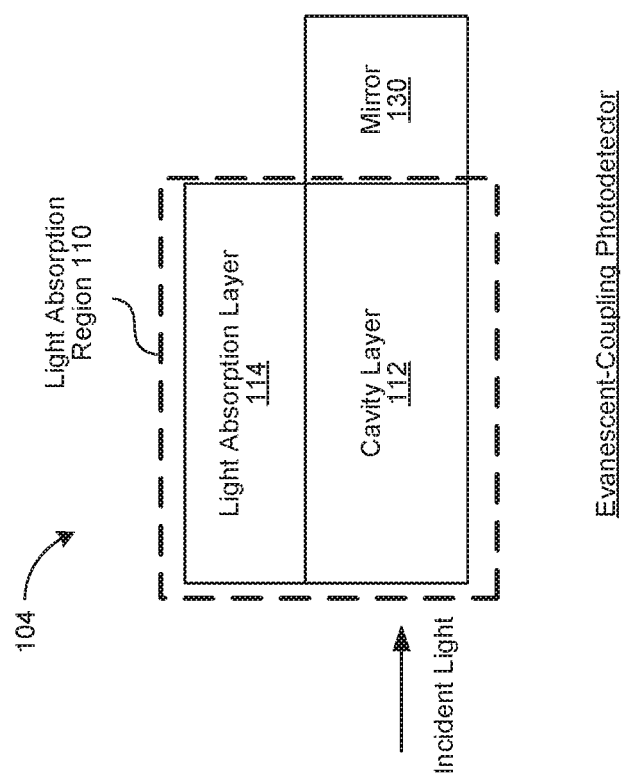

It is observed that the aforementioned trade-off between responsivity and bandwidth in conventional photodetector designs is undesirable. One conventional attempt to overcome this drawback is to place a mirror structure (or a reflective region) adjacent to the light absorption region to reflect the light back to the light absorption region. FIGS. 1A-1B illustrate the cross-sectional views of three different photodetector structures all implementing this conventional approach. Note that the structures shown in FIGS. 1A-1B, as well as in other figures throughout this disclosure, are for illustration purposes only; consequently, certain well-known structures (e.g., substrate) may be omitted in one or more figures for simplicity. The three different types of photodetectors include a butt-coupling photodetector 100, a normal-incidence photodetector 102, and an evanescent-coupling photodetector 104.

As shown, incident light enters a light absorption region (or light absorption cavity) 110 of the photodetectors 100, 102, and 104 at one end of the light absorption region 110; a mirror structure (or a reflective region) 130 can be positioned at the other end of the light absorption region 110 to reflect the incident light back to the light absorption region 110. While this approach improves the responsivity because the incident light's travel path doubles, the improvement is limited. Also, adding the mirror 130 may cause well-known back-reflection issues. It is further observed that one important reason for this bandwidth and responsivity trade-off in the conventional photodetector designs is caused by the light not being confined inside the light absorption region 110, and henceforth the absorption of light can only take place during a limited amount of light passes (which is two in the above examples of FIGS. 1A-1B) inside the light absorption region 110.

Introduced here is a technique to overcome such trade-off by providing a way to confine the incident light in the light absorption region 110 for reaching high responsivity without sacrificing bandwidth. More specifically, by confining the incident light, the total volume (e.g., thickness) of the light absorption material can be greatly reduced without sacrificing much or even any responsivity, because the light remains within the light absorption region 110 (or light absorption cavity such as cavity layer 112 of FIG. 1B) until the light is absorbed by the light absorption material. This smaller size can bring the benefit of higher bandwidth.

As described further below, the apparatus and technique introduced herein decouple the traditional relationship between bandwidth and responsivity, thereby providing a more flexible and wider photodetector design space for next generation high-speed photodetector applications. In certain embodiments, a photodetector device includes a first mirror, a second mirror, and a light absorption region positioned between the first and second reflective mirrors. For example, the first mirror can be a partial mirror, and the second mirror can be a high-reflectivity mirror. The incident light can be guided from a waveguide, through the first mirror, and then enter the light absorption region. The light absorption region is positioned to absorb incident light that is passed through the first mirror and reflected between the first and second mirrors. The first mirror can be configured to exhibit a reflectivity that causes an amount of energy of light escaped from the first mirror, after being reflected back by the second mirror, to be zero or near zero. That is to say, in ways discussed herein, the present technique can configure the optical parameters of the first mirror together with the second mirror and the light absorption region such that a substantial amount of energy of the incident light can be captured by or confined within the light absorption region. In this way, embodiments of the present technique can enjoy both high bandwidth and high responsivity. Some photodetector embodiments of the present technique may achieve a bandwidth of over 40 Gbit/s as compared to 10-25 Gbit/s of traditional photodetectors. Also, the thickness (e.g., in a normal-incidence photodetector) or the length (e.g., in a butt-coupling photodetector) of the light absorption region may be reduced from 3 µm or thicker to around 200 nm.

Additionally, methods for designing a photonic lock based photodetector, which may be embodied by an electronic design automation (EDA) software application, are discussed below.

In the following description, numerous specific details are set forth to provide a thorough understanding of the present disclosure. It will be apparent to one skilled in the art that the techniques introduced here may be practiced without these specific details. In other instances, well-known features, such as specific fabrication techniques, are not described in detail in order to not unnecessarily obscure the present disclosure. References in this description to "an embodiment," "one embodiment," or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics may be combined in any suitable manner in one or more embodiments. Also, it is to be understood that the various exemplary embodiments shown in the figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

For example, the light absorption region 110 in FIG. 1B may be described herein as positioned "between" the incident light as shown and the mirror 130, even though not all portions of the light absorption region 110 (e.g., the light absorption layer 114) are directly located on the same planar surface (e.g., on top of a substrate) as the incident light and the mirror 130. For another example, the light absorption layer 114 in FIG. 1B may be described herein as disposed "over" the cavity layer 112, even though the light absorption layer 114 may not directly contact the cavity layer 112, such as the case where an interfacial layer (not shown in FIG. 1B) is sandwiched between the light absorption layer 114 and the cavity layer 112.

Also, except where otherwise indicated or made apparent from the context, some of the terms may be used herein interchangeably. For example, the term "attenuation coefficient" or "absorption coefficient" of a light absorption region generally means the coefficient or constant representing, when light travels in the light absorption region, how much amount of light energy remains (in percentages as compared to the light's initial incident energy) after the light being attenuated inside the light absorption region. The term "round-trip" or "one-circulation" means that the light travels from a first end (e.g., of a light absorption region) to a second end, and then returns (e.g., as being reflected) from the second end back to the first end.

The term "reflect" means that the reflectivity for an incident light beam in at least one specific wavelength range, for example, in the near infrared region, is greater than 0%.

Figure 2:
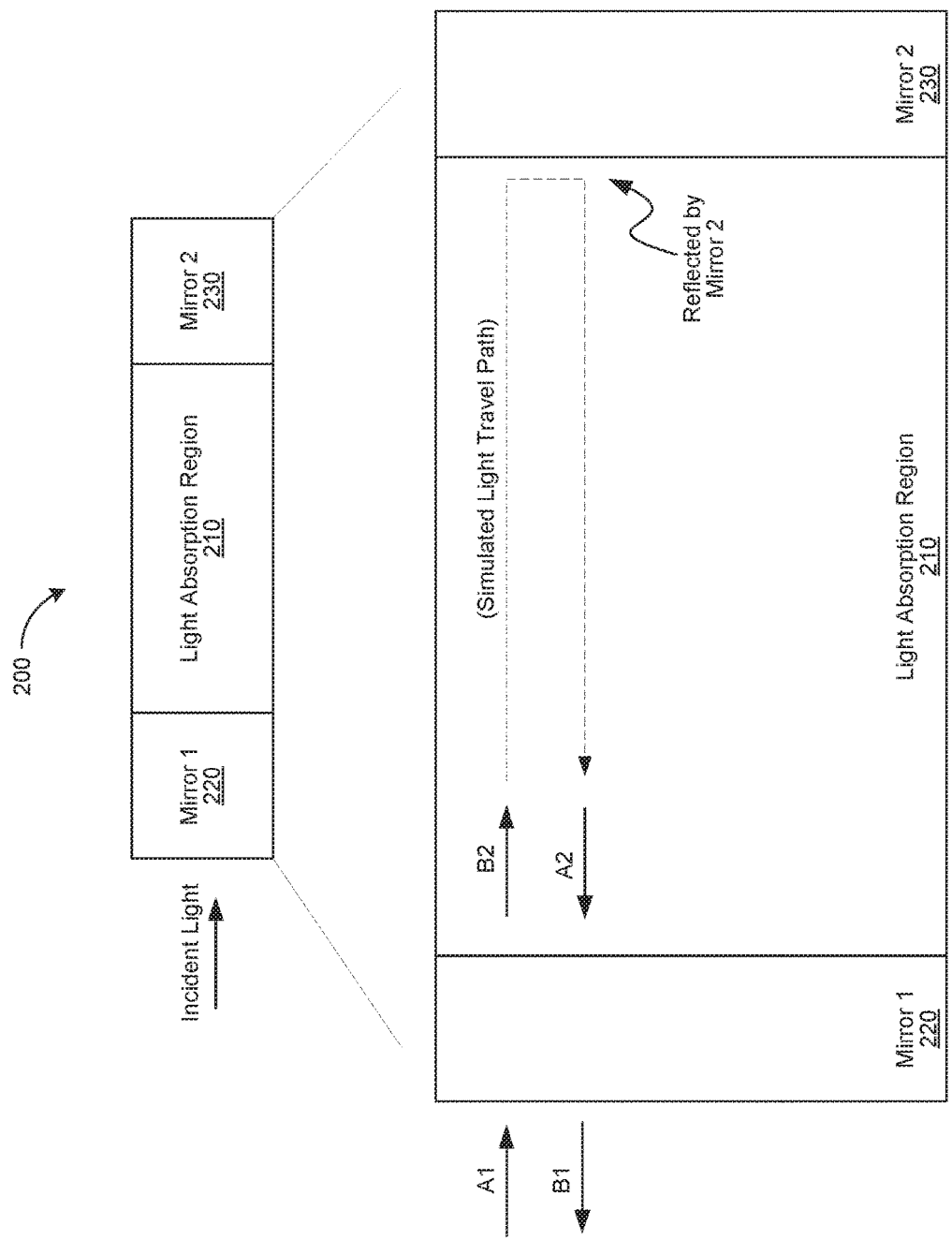
FIG. 2 illustrates a cross-sectional view showing relevant details of implementing a photonic lock based photodetector in accordance with some embodiments.

FIG. 2 illustrates a cross-sectional view showing relevant details of implementing a photonic lock based photodetector 200 in accordance with some embodiments. The photodetector 200 includes a light absorption region 210, a first mirror (or a reflective region) 220, and a second mirror 230. For purposes of explanation, the following discussion assumes that the photodetector 200 is a butt-coupling type photodetector; however, the technique introduced here can be applied to any suitable semiconductor photodetector.

As mentioned above, for a conventional photodetector, its light absorption region needs to be long enough within the incident light's travel direction in order to absorb enough light. This limitation places a bottleneck on the bandwidth such conventional photodetector can reach. Accordingly, the photodetector 200 includes a photonic lock mechanism to confine the light inside the light absorption region 210 so that the light stays in the light absorption region 210 until the light is completely or nearly completely absorbed by the light absorption material. To this end, one aspect of the technique is to position two mirrors (e.g., the first mirror 220 and the second mirror 230), one mirror on each side of the light absorption region 210, so as to form a photonic lock. The photonic lock confines the incident light inside the light absorption region 210, and therefore the incident light can travel multiple times (by being reflected between the mirrors 220 and 230) inside the light absorption region 210 for almost all the light to be absorbed More specifically, in order to "lock" the light inside the light absorption region 210, the photonic lock is configured such that an amount of energy of light escaped from the first mirror 220, after being reflected back by the second mirror 230, is to be zero or near zero. In order to reach such lock condition, the optical parameters of the first mirror 220, together with that of the second mirror 230 and the light absorption region 210, are configured such that a substantial amount of energy of the incident light is captured by or confined within the light absorption region 210. In one or more embodiments, (a) a reflectivity of the first mirror 220, (b) a reflectivity of the second mirror 230, and (c) an attenuation coefficient of the light absorption region 210 are configured together such that, when the incident light enters the light absorption region 210 and reflects between the first mirror 220 and the second mirror 230, the light resonates and becomes substantially locked in the light absorption region 210.

With reference to FIG. 2, some physical principles operating behind the photonic lock condition for implementing the photonic lock photodetectors are now described. As shown in FIG. 2, it is assumed that the incident light enters into the light absorption region 210 through the first mirror 220. Note that, in one or more embodiments, the first mirror 220 is a partial reflector that allows a portion of the light (and its energy) transmitted into the cavity, and the second mirror 230 is a total reflector that reflects a majority of the light (and its energy) back into the light absorption region 210. As such, in one or more embodiments of the photodetector 200, the first mirror 220's reflectivity is smaller than the second mirror 230's reflectivity. In the following discussion, it is assumed that the second mirror 230 is a perfect reflector (i.e., its reflectivity reaches 100%) for simplicity. If the second mirror 230's reflectivity is less than perfect, the technique introduced here can still be effective; however, the efficiency may degrade due to the second mirror 230's imperfection. Also note that, although not depicted in FIG. 2, the light absorption region 210 may include one or more materials and/or structures. For example, in certain embodiments, the light absorption region 210 can employ a photodiode structure or an avalanche photodiode structure.

Now, assuming that the transmissivity of the first mirror 220 is T, and that the reflectivity of the first mirror 220 is R1, then a scattering matrix (or an "S-matrix") can be used representing the steady state of the above-said structure when the incident light enters:

$$\begin{pmatrix} \sqrt{B1} \\ \sqrt{B2} \end{pmatrix} = \begin{pmatrix} -\sqrt{R1} & \sqrt{T} \\ \sqrt{T} & \sqrt{R1} \end{pmatrix} \begin{pmatrix} \sqrt{A1} \\ \sqrt{A2} \end{pmatrix} \qquad \text{Eq. (1)}$$

where A1, A2, B1, and B2 each represent the optical intensity (or power) of the incident light at a different stage, as shown in FIG. 2.

Furthermore, because the law of conservation of energy, R1 and T has the following relationship:

$$R1+T=1 \qquad \text{Eq. (2)}$$

Now, let α represent a one-circulation attenuation coefficient of the light absorption region 210. As used herein, the one-circulation attenuation coefficient of the light absorption region 210 represents how much light remains in the light absorption region 210 when the light travels from entering the light absorption region 210 to exiting the light absorption region 210, having been reflected by the second mirror 230, assuming the exiting point of the incident light is the same as the entry point.

Furthermore, let A2 represent the optical intensity of the incident light after being passed into the light absorption region 210, through the light absorption region 210, to the second mirror 230, and being reflected from the second mirror 230, through the light absorption region 210 again, to immediately before exiting the light absorption region 210. Then, A2 can be denoted by:

$$A2 = B2\alpha \qquad \text{Eq. (3)}$$

In other words, when the light enters the light absorption region 210, α indicates the ratio of remainder light energy A2 over entrance light energy B2 in one circulation.

Note that, in some examples, α can be expressed as a function of R2, the reflectivity of the second mirror 230:

$$\alpha \approx R2 e^{-n_i k_0 4 d} \qquad \text{Eq. (4)}$$

where $n_i$ is the imaginary part of cavity refractive index, $k_0$ is the free-space wavenumber, and d is the cavity length (i.e., the distance between the first mirror 220 and the second mirror 230).

According to the technique introduced here, a substantial amount of energy of the incident light is to be captured by or confined within the light absorption region 210 so as to reach the aforementioned photonic lock condition. Assuming no phase change is introduced by the first and second mirrors for purposes of discussion herein, when the light resonates in the light absorption region 210, the one-circulation phase change θ is equal to 2 mπ (where m is integer), and therefore, by combining equation (2) and equation (3) into the S-matrix in equation (1), the following equation results:

$$B1/A1 = (\sqrt{\alpha} - \sqrt{R1})^2 / (1 - \sqrt{\alpha}\sqrt{R1})^2 \qquad \text{Eq. (5)}$$

It can be seen from equation (5) that, if R1=α, then B1=0. Consequently, to reach a photonic lock condition as described here, an amount of energy of light escaped from the first reflective region (e.g., B1), after the light being reflected by the second reflective region, should be substantially zero, meaning that a substantial amount of energy of the incident light is captured by or confined within the light absorption region 210. Accordingly, one or more embodiments of the first mirror 220 is configured to exhibit a reflectivity R1 that substantially equals a one-circulation attenuation coefficient of the light absorption region α.

With the above steady-state description in mind, the following describes a transient-state example to further illustrate the physical principles behind the photonic lock photodetectors. Assuming R1 is 10%, if the one-circulation attenuation coefficient α is designed to be 10% as well, then photodetector 200 can reach the aforementioned photonic lock condition "α=R1" when it operates. Consider the following scenario, after an incident light passes through the first mirror 220 and becomes 90%, it travels through the light absorption region 210 while being absorbed by the region 210, gets reflected from the second mirror 230, and makes another pass through the region 210. Since α is designed to be 10%, before this light exits the region 210 and meets the first mirror 220 again, the one-circulation optical intensity of the light becomes 90%×10%=9%. Because the first mirror 220 is a reciprocal structure, when this light encounters the first mirror 220, 0.9% (which is 9%×10%) of the light may appear to be reflected back into the region 210 and 8.1% of the light may appear to pass through the first mirror 220 without being absorbed by the cavity.

However, despite the amount of energy the light appears to leak or escape from the first mirror 220 being 10% (e.g., on "zero pass") and 8.1% (e.g., on "first pass"), it is observed here that these lights escape at different phases. More specifically, these escaped lights create destructive interferences to each other, and therefore the energy that actually leaks outside the light absorption region 210 can be smaller than what it appears in the above calculations (e.g., the sum of 10% and 8.1%).

According to the technique disclosed here, when the optical parameters of the first mirror 220, the light absorption region 210, and the second mirror 230 are configured together such that the photodetector 200 can reach the photonic lock condition (i.e., "α=R1") when it operates, after numerous light passes, essentially all the light that leaks out cancels each other because of destructive interference, meaning that almost all the power of the original incident light Al is trapped inside and absorbed by the light absorption region 210.

Note that, although many non-ideal factors such as process condition and variation may exist, the technique introduced here can still bring similar benefits even when there is a slight deviation from the ideal "α=R1" case, only that the confinement efficiency may be lower.

Figure 3:
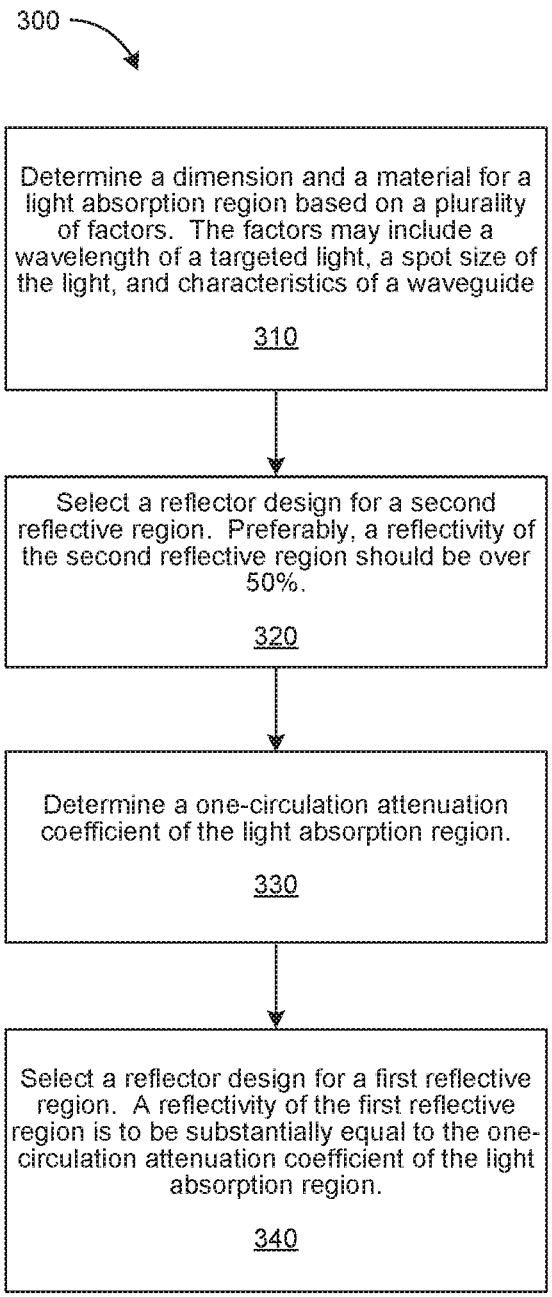
FIG. 3 illustrates a flow diagram showing an example of a design process that may be implemented by an electronic design automation (EDA) software application for designing a photonic lock based photodetector.

FIG. 3 illustrates a flow diagram showing an example of a design process 300 that may be implemented by an electronic design automation (EDA) software application for designing a photonic lock based photodetector (e.g., the photodetector 200). Note that, while methods introduced here include a number of steps or operations that are described and/or depicted as performed in a specific order, these methods may include more or fewer steps, which may be performed in serial or in parallel. Also, an order of two or more steps may be changed, performance of two or more steps may overlap, and two or more steps may be combined into a single step.

First, a dimension and a material for a light absorption region can be determined (310) based on a plurality of design factors. The design factors include a target light's wavelength, its spot size, and characteristics of the waveguide or coupling device (e.g., the optical fiber on top of a grating, or the waveguide coupled to the first mirror).

Then, a reflector design for the second mirror can be selected (320). The second mirror is to reflect a majority of the light back into the light absorption region. In one or more embodiments, the second mirror is designed to have as high reflectivity as allowable (i.e., as close to 100% as possible) by the fabrication process. Some examples of the second mirror can include a DBR mirror, a loop-mirror, a corner mirror, a metal mirror, an oxide mirror, a nitride mirror, a tapered DBR structure, or a suitable combination of the above. According to certain embodiments, the second mirror's reflectivity is higher than 50%.

Optionally, in those embodiments that have grating over the light absorption region for example, a standing wave pattern inside the light absorption cavity can be calculated using known methods so that the grating design (e.g., its reflectivity index) can be selected or adjusted based on the calculation. Other types of known grating design can also be incorporated over the light absorption cavity.

Next, a one-circulation attenuation coefficient (α) of the light absorption region can be determined (330) based on the results of steps 310 and 320. The one-circulation attenuation coefficient represents how much light (in terms of its optical intensity) remains in the light absorption region when the light travels from entering the light absorption region to exiting the light absorption region, having been reflected by the second reflective region and assuming the exiting point is on the same end of the light absorption region as the entry point.

Thereafter, a reflector design for a first mirror can be selected (340). As discussed above, a reflectivity of the first mirror is configured to be substantially equal to the one-circulation attenuation coefficient (α) of the light absorption region. Similar to the second mirror, designs the first mirror can include a DBR mirror, a loop-mirror, a corner mirror, a metal mirror, an oxide mirror, a nitride mirror, a tapered DBR structure, or a suitable combination of the above. According to certain embodiments, the first mirror's reflectivity is lower than 50% or lower than the reflectivity of the second mirror. It is noted that, because the light can be trapped inside the light absorption cavity, the length or the thickness of the light absorption cavity itself can become relatively short as compared to traditional photodetectors. In one example, the length of the light absorption region is shorter than 1 μm. In other examples, the length can be reduced to hundred-nanometer range and still enjoy high responsivity and bandwidth.

Although not depicted in FIG. 3, a designer (or the EDA software application) may run simulations to verify and, if necessary, repeat the above steps to adjust or optimize various design parameters in order to better suit the application's need.

Also, note that the exact dimensions of various components in a photonic lock based photodetector (e.g., the length, width, and thickness thereof) should be so adapted that they match or at least as be as close as possible to the aforementioned photonic lock condition. Such condition depends on various factors including the spot size of the incident light, the mode of the light, the wavelength of the light, the material of the absorption cavity region, the material and reflectivity of the mirrors, and so forth. These choices may affect the confinement efficiency (henceforth the responsivity and bandwidth); however, these design choices are a part of the optimization process, which does not change the aforementioned operating principles of the photonic lock. Therefore, a person skilled in this art will be able to apply the technique introduced here in performing design optimization.

Figure 4:
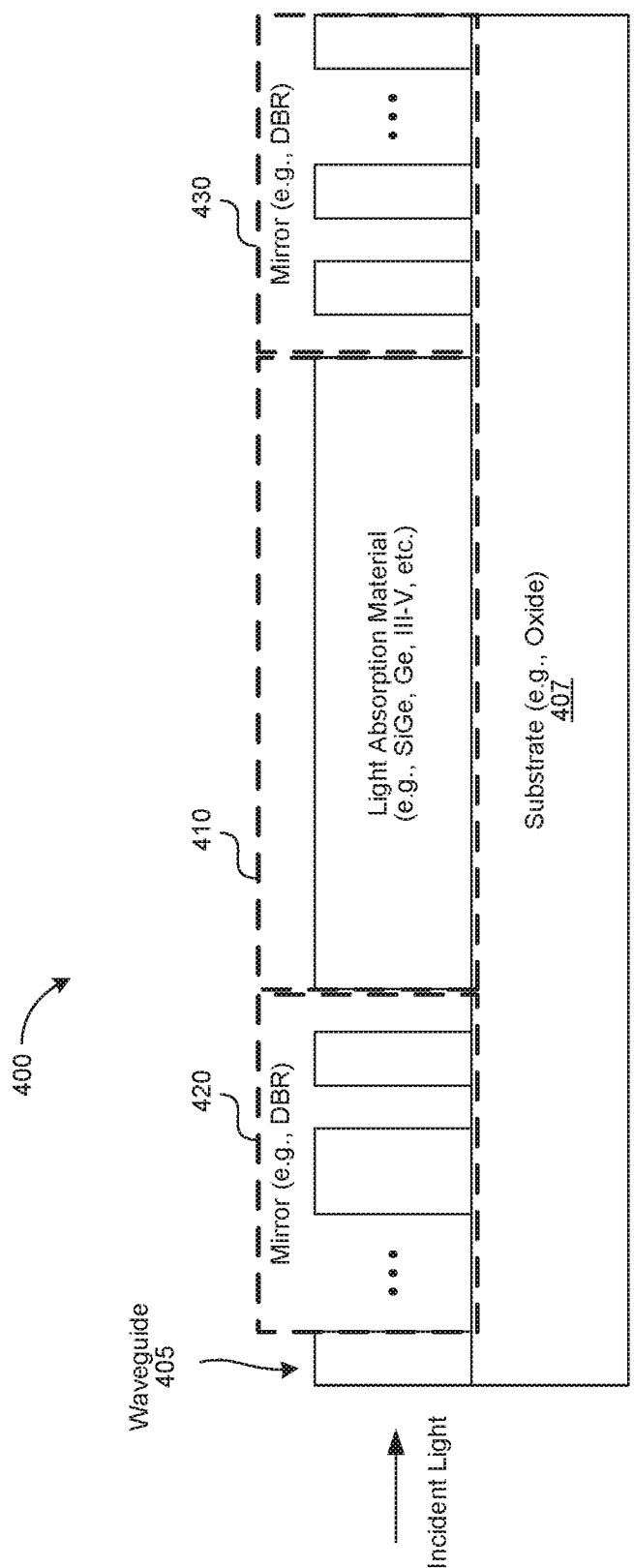
FIG. 4 illustrates a cross-sectional view of an example implementation of a butt-coupling photodetector incorporating the technique introduced here.

FIG. 4 illustrates a cross-sectional view of an example implementation of a butt-coupling photodetector 400 incorporating the technique introduced here. The photodetector 400 includes a substrate 407, a waveguide 405, a first mirror region (or reflective region) 420, a light absorption region 410, and a second mirror region 430. With reference to the components shown in FIG. 4, a method for forming the photodetector 400 is introduced.

Firstly provided is the substrate 407, which can be silicon dioxide ($SiO_2$) or other suitable oxide. In variations, the substrate 407 may comprise other materials, for example, gallium arsenide (GaAs), glass, polymer, or oxynitride.

As shown in FIG. 4, the waveguide 405 is formed over the substrate 407. The waveguide 405 is configured to receive an incident light (e.g., which may be an optical signal from an optical fiber, not shown in FIG. 4) and to pass the incident light through the first reflective region 420 into the light absorption region 410. In one embodiment, the waveguide 405's material comprises silicon (Si). Additionally or alternatively, other suitable materials can be used, for example, aluminum gallium arsenide (AlGaAs), nitride, or polymer. In some embodiments, the waveguide 405 is a single-mode silicon waveguide. Note that, in general, the waveguide material needs to exhibit a smaller absorption rate than that of the absorption layer itself at the intended operational wavelength. In some examples, the material of the waveguide layer has a larger band gap as compared to that of the absorption layer.

The first reflective region 420 and the second reflective region 430 can be formed over the substrate 407. As shown, the first reflective region 420 and the second reflective region 430 can be formed on the same planar surface. In some examples where the first and second reflective regions 420 and 430 are made of the same material as the waveguide 405, all three structures can be formed (e.g., on or over the substrate 407) using the same step or steps.

Next, the light absorption region 410 is formed between the first and second reflective regions 420 and 430. For example, a light absorption material, such as germanium, silicon-germanium, or other Group III-V materials, can be disposed or chemically deposited on substantially the same planar surface as the first and second reflective regions 420 and 430 (e.g., over the substrate 407). The light absorption region 410 is positioned such that it can absorb light that passes through the first reflective region 420 and reflects between the first reflective region 420 and the second reflective region 430. In the butt-coupling example of FIG. 4, the light absorption material is formed on substantially the same planar surface as the first and second reflective regions 420 and 430. This can be implemented by one or more known etching and chemical deposition processes. Note that the light absorption region 410 can also be formed prior to the formation of the first and second reflective regions 420 and 430.

As mentioned above, the first reflective region 420 is configured to exhibit a reflectivity that causes an amount of energy of light escaped from the first reflective region, after being reflected by the second reflective region, to be substantially zero. In one or more embodiments, the first reflective region 420's reflectivity is configured to be substantially equal to a one-circulation attenuation coefficient of the light absorption region 410.

Figure 5:
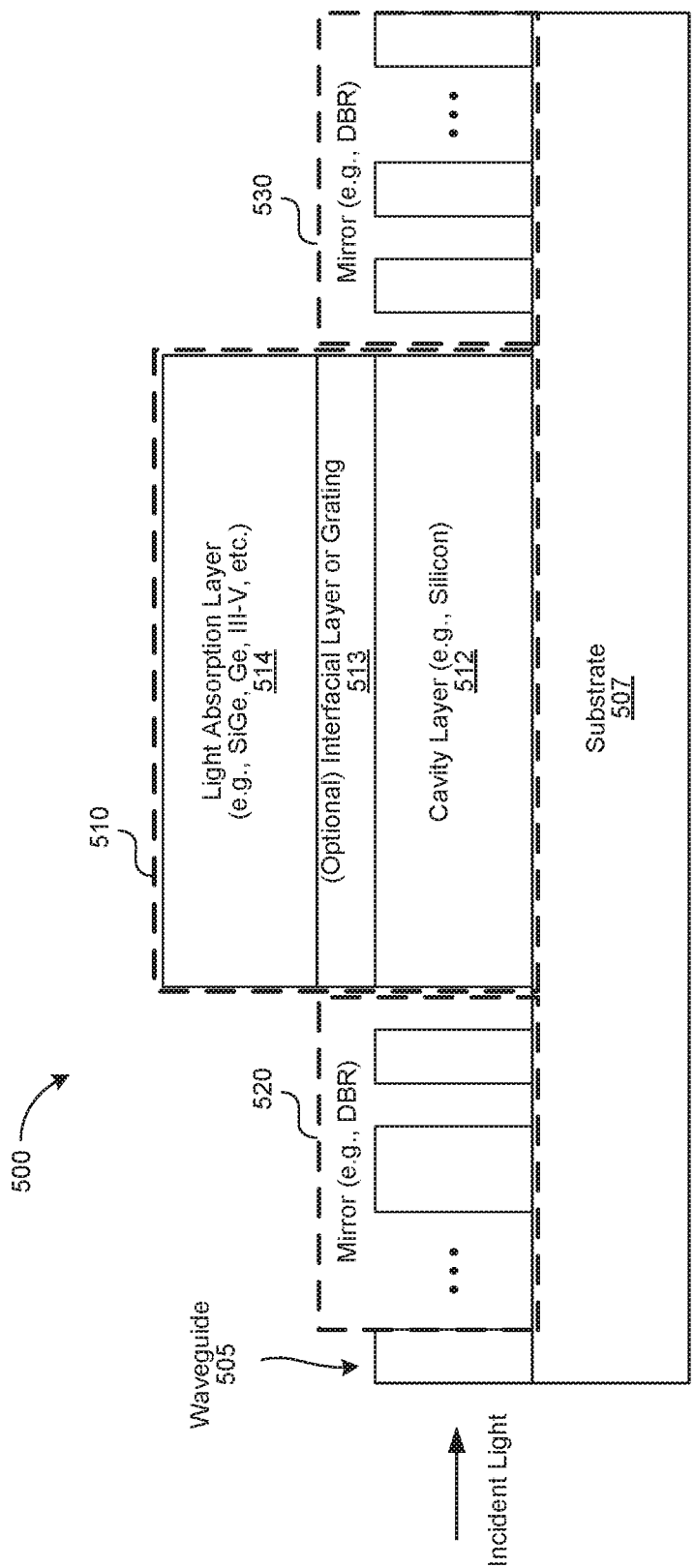
FIG. 5 illustrates a cross-sectional view of an example implementation of an evanescent-coupling photodetector incorporating the technique introduced here.

FIG. 5 illustrates a cross-sectional view of an example implementation of an evanescent-coupling photodetector 500 incorporating the technique introduced. Similar to the photodetector 400, the photodetector 500 includes a substrate 507, a waveguide 505, a first reflective region 520, a light absorption region 510, and a second reflective region 530. The structures and manufacturing processes for the waveguide, the substrate, and the first and second reflective regions of the photodetector 500 are similar to those of the photodetector 400 introduced above.

For the light absorption region 510, one difference between the evanescent-coupling photodetector 500 and the butt-coupling photodetector 400 is that a cavity layer 512 (i.e., instead of the light absorption material) is first disposed on substantially the same planar surface as the first and second reflective regions 520 and 530. This can be formed during the step of forming the first and the second reflective regions 520 and 530. In some embodiments, the cavity layer 512 includes the same material as the first and second reflective regions 520 and 530.

Then, optionally, one or more interfacial layers (e.g., an anti-reflection coating, material stacks (for better crystal size matching), and/or a quarter-wavelength layer) or grating layers 513 can be disposed over the cavity layer 512 to improve optical characteristics of the interface between the cavity layer 512 and a light absorption layer 514. In some examples, the grating layer 513 can be designed to match the standing wave pattern inside the cavity layer 512. By matching the wave pattern, the grating layer 513 may function similarly to an antenna, providing an efficient conduit for the light to leave the cavity layer 512 into the light absorption layer 514. More specifically, in some embodiments, the grating layer 513 can be designed such that a period of the grating equals two times the distance between two maximum power points of the standing wave pattern of the light traveling in the cavity layer 512. In this way, all point wave-fronts emitted from individual grating structure may be combined into a planar wave front, which in this turn propagates upward into the light absorption layer 514.

Thereafter, the light absorption layer 514 which contains the light absorption material can be disposed over the cavity layer 512. It is noted that this process of fabricating the photodetector 500 may be advantageous over the process of fabricating the photodetector 400 in certain implementations where the material of the light absorption layer 514 can be more easily disposed over the cavity layer 512 (whether it is with or without the interfacial layer 513) than over the substrate 507.

Although not depicted in FIG. 5, in another embodiment, the incident light can enter from the top of the absorption layer 514. In accordance with the technique introduced here, the amount of light not absorbed on the first pass can still become confined (or "locked") in the cavity layer 512 while being evanescently absorbed by the absorption layer 514.

Figure 6:
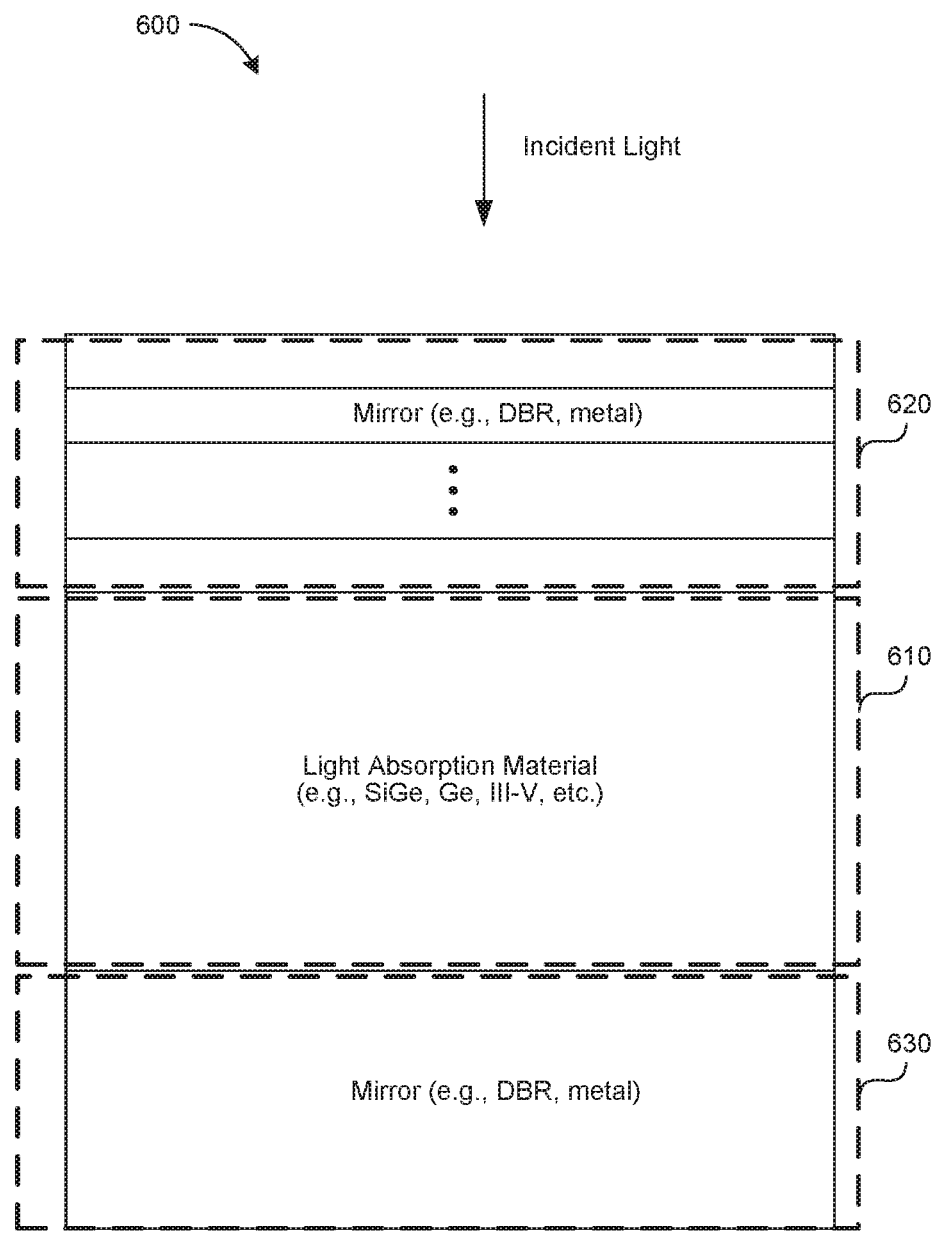
FIG. 6 illustrates a cross-sectional view of an example implementation of a normal-incidence photodetector incorporating the technique introduced here.

FIG. 6 illustrates a cross-sectional view of an example implementation of a normal-incidence photodetector 600 incorporating the technique introduced here. Similar to the photodetector 400, the photodetector 600 includes a first reflective region 620, a light absorption region 610, and a second reflective region 630. The structures for the first and second reflective regions of the photodetector 600 are similar to those of the photodetector 400 introduced above. With reference to the components shown in FIG. 6, a method for forming the photodetector 600 is introduced.

Firstly provided is a substrate, which can be a silicon dioxide ($SiO_2$) or other suitable oxide. In variations, the substrate may comprise other materials, for example, gallium arsenide (GaAs). Note that, in certain embodiments, after the reflective and absorption structures are formed, the substrate can be removed by an etching process, hence not shown in FIG. 6.

Then, the second reflective region 630 is formed over the substrate. As mentioned above, some examples of the second reflective region 630 can include a DBR mirror, a metal mirror, an oxide mirror, a nitride mirror, a tapered DBR structure, or a suitable combination of the above. According to certain embodiments, the second reflective region 630's reflectivity is higher than 50%. In one or more embodiments, the second reflective region 630 is designed to have as high reflectivity as allowable (i.e., as close to 100% as possible) by the fabrication process.

Next, the light absorption region 610 is formed over the second reflective region 630. For example, a light absorption material, such as germanium, silicon-germanium, or other Group III-V materials, can be disposed, bonded, attached, or otherwise chemically deposited over the second reflective region 630.

Thereafter, the first reflective region 620 is formed over the light absorption region 610. As mentioned above, the first reflective region 620 is configured to exhibit a reflectivity that causes an amount of energy of light escaped from the first reflective region 620, after being reflected by the second reflective region 630, to be substantially zero. In one or more embodiments, the first reflective region 620's reflectivity is configured to be substantially equal to a one-circulation attenuation coefficient of the light absorption region 610.

Note that, the above example process is merely one example of forming the normal-incidence photodetector 600. As a variation, the second reflective region 630 can be formed by first removing the portion of substrate beneath the light absorption structure 610, and then coating the etched opening with a reflective material (e.g., metal) to function as the second reflective region 630, and this fabrication process can be performed after the first reflective region is made.

In one variation, the first reflective region 620 can be formed on the substrate, and then the light absorption region 610 is disposed on top of the first reflective region 620, which can be followed by disposing the second reflective region 630 on top of the light absorption region 610. Thereafter, the substrate can be removed, thereby forming the structure 600 as shown in FIG. 6.

In another variation, the first reflective region 620 can be formed by first removing the substrate portion beneath the light absorption region 610, and then coating the etched opening with one or more reflective materials (e.g., multiple layers of oxide and nitride to form a DBR mirror structure) so as to function as the first reflective region 620. In some embodiments, this removing and coating fabrication processes can be performed after the second reflective region 630 is fabricated.

Subsequently, an optical coupling apparatus (not shown in FIG. 6) can be coupled to the first reflective region 620. It is configured to receive an incident light (e.g., which may be an optical signal from an optical fiber, not shown in FIG. 6) and to pass the incident light through the first reflective region 620 into the light absorption region 610.

FIGS. 7A-7H illustrate various examples of mirror designs, which can be adapted in the photonic lock based photodetectors introduced here. For simplicity, only examples of butt-coupling photodetectors are shown in FIGS. 7A-7H; however, similar techniques can be applied to different types of photodetectors. In addition, although the first and the second mirrors in each of FIGS. 7A-7H are illustrated as embodying a certain combination of mirror designs, all the mirror designs illustrated here, as well as other well-known mirror designs, can be adapted for implementing any mirror region (or reflective region) described in the present disclosure.

Figure 7A:
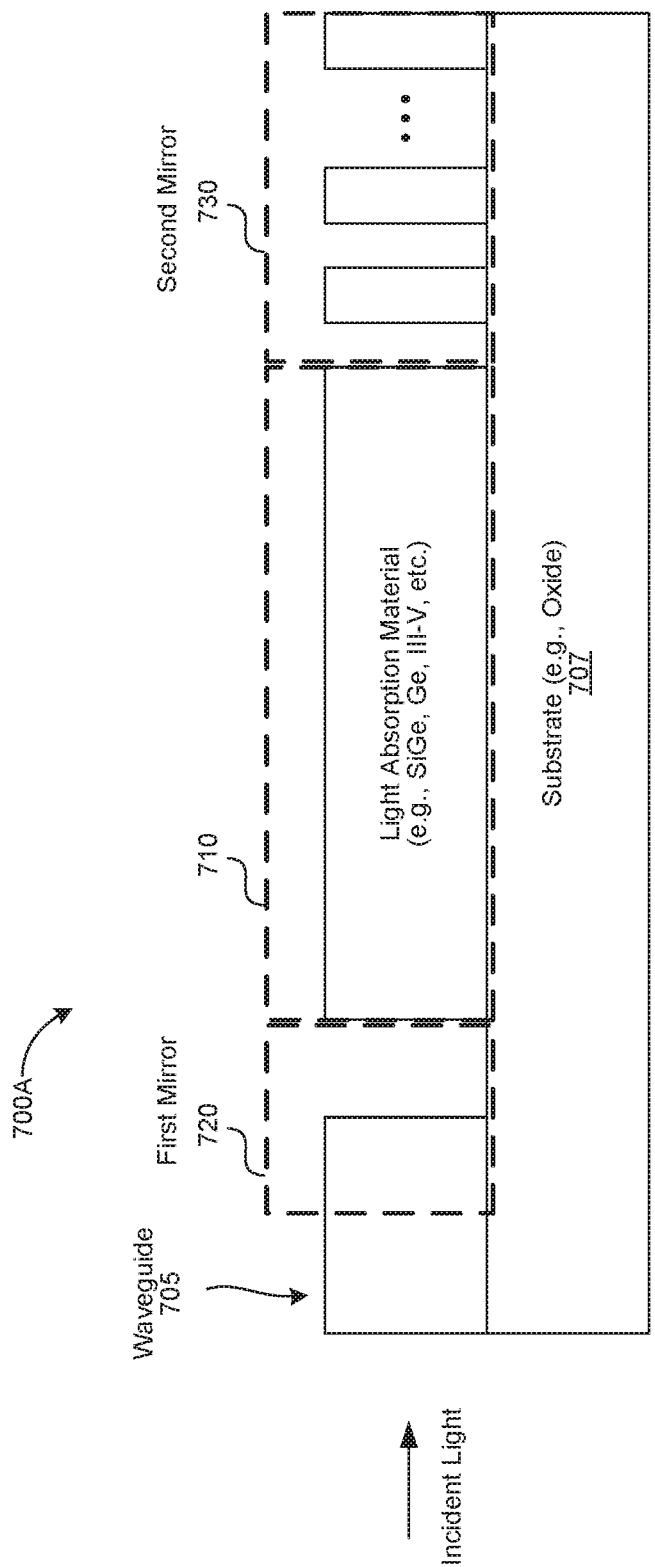
FIGS. 7A-7H illustrate various examples of mirror designs, which can be adapted in the photonic lock based photodetectors.

FIG. 7A illustrates a cross-sectional view of an example implementation of a butt-coupling photodetector 700A. The first mirror 720 can be a high reflection tapered DBR or a low reflection trench. It is noted that using a tapered DBR structure as the second mirror 730 may provide a better light locking mechanism as compared to other types of mirror.

Figure 7B:
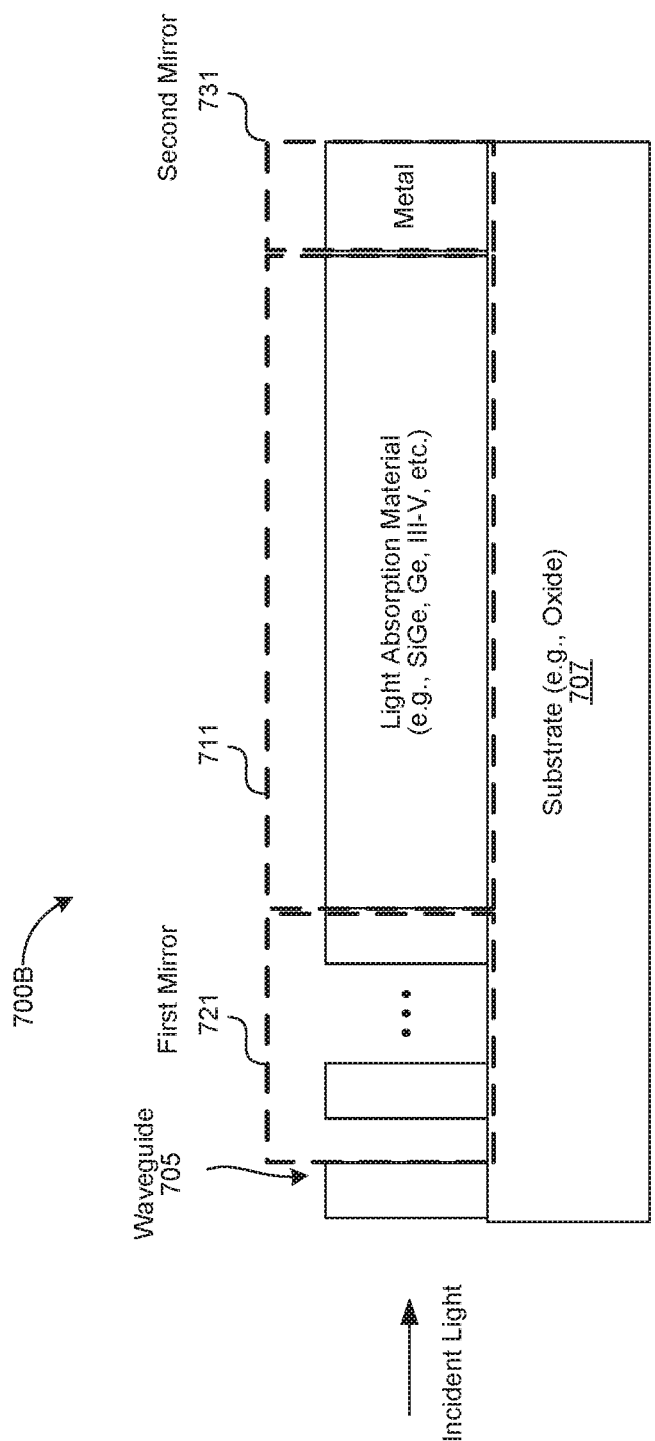

FIG. 7B illustrates a cross-sectional view of an example implementation of a butt-coupling photodetector 700B. The second mirror 731 is implemented via a coating of metal, and the first mirror 721 is implemented using a tapered DBR structure.

Figure 7C:
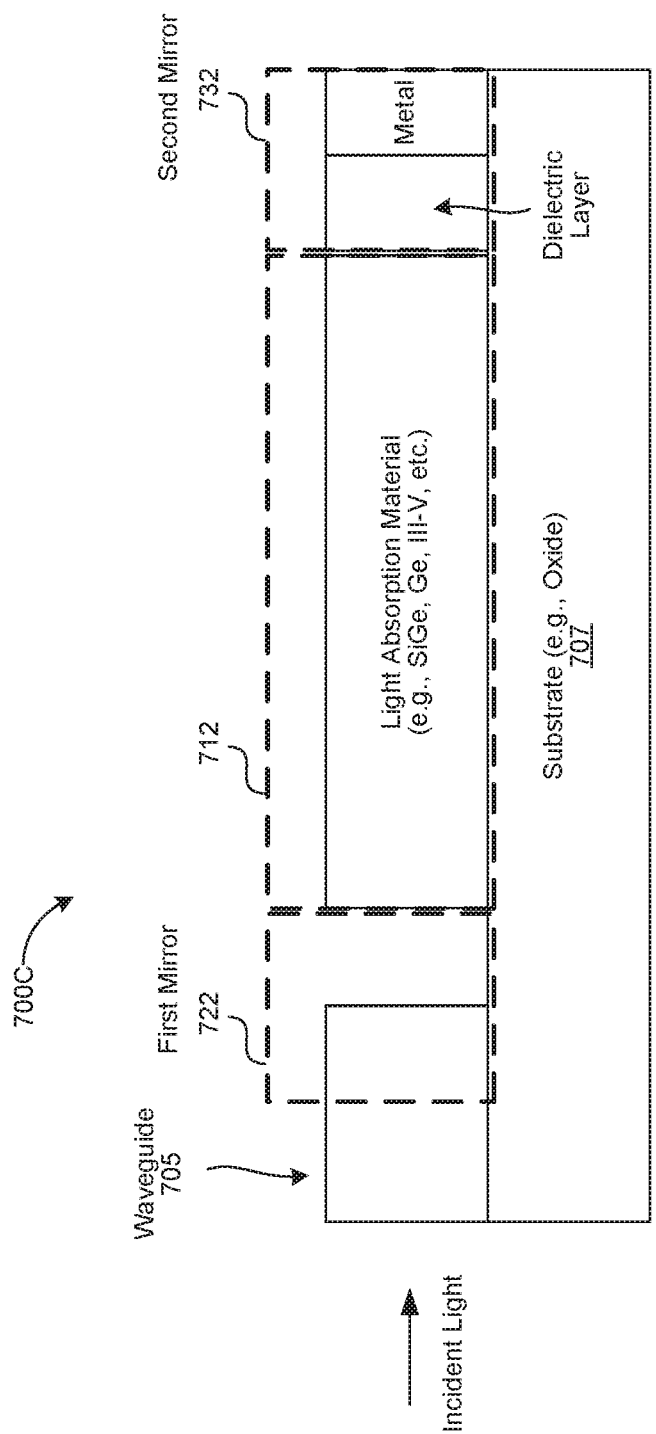

FIG. 7C illustrates a cross-sectional view of an example implementation of a butt-coupling photodetector 700C. The second mirror 732 includes a dielectric layer, for example, a quarter wavelength oxide layer, and the first mirror 722 is implemented using a trench structure.

Figure 7D:
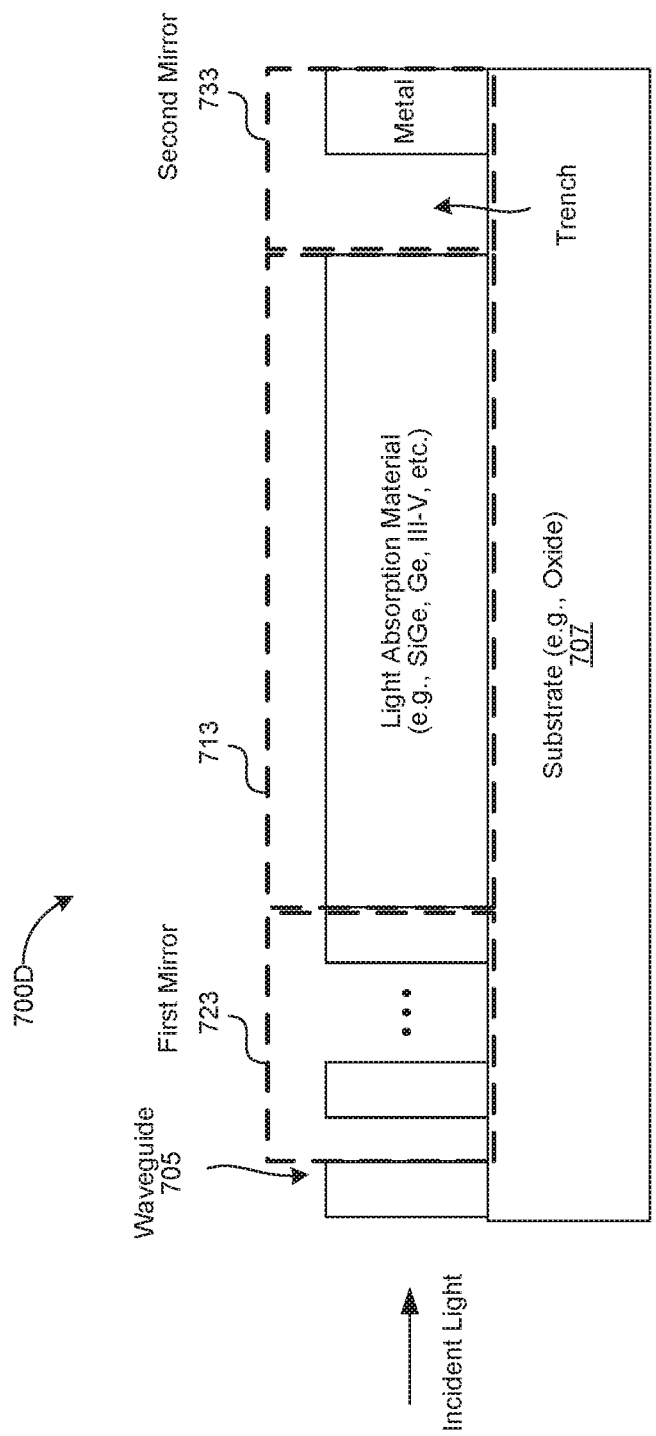

FIG. 7D illustrates a cross-sectional view of an example implementation of a butt-coupling photodetector 700D. The second mirror 733 includes a trench, and the first mirror 723 is implemented using a tapered DBR structure.

Figure 7E:
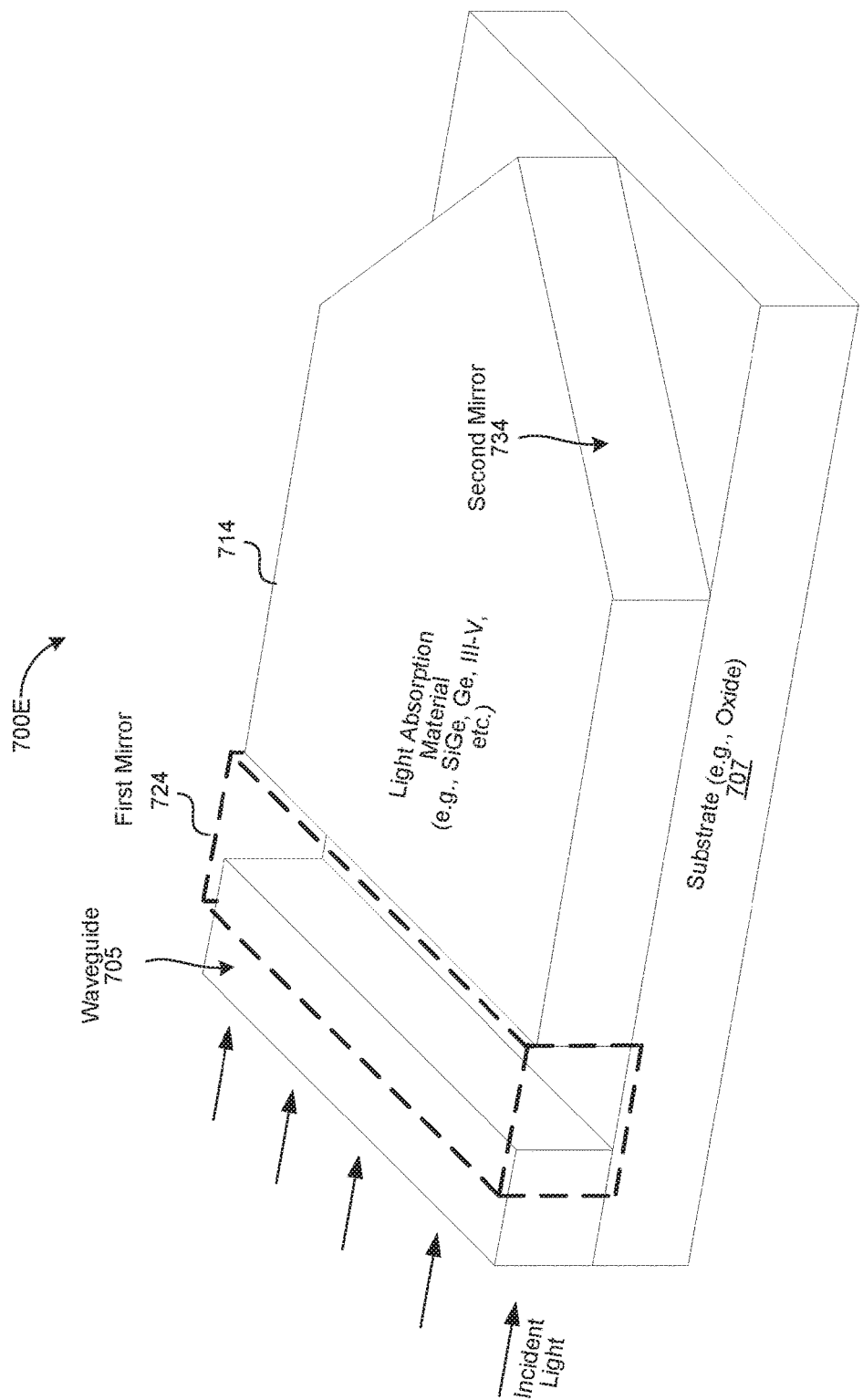

FIG. 7E illustrates a perspective view of an example implementation of a butt-coupling photodetector 700E. The second mirror 734 includes a corner mirror that is made of the same material as the light absorption region 714. As shown in FIG. 7E, the first mirror 724 is implemented using a trench structure.

Figure 7F:
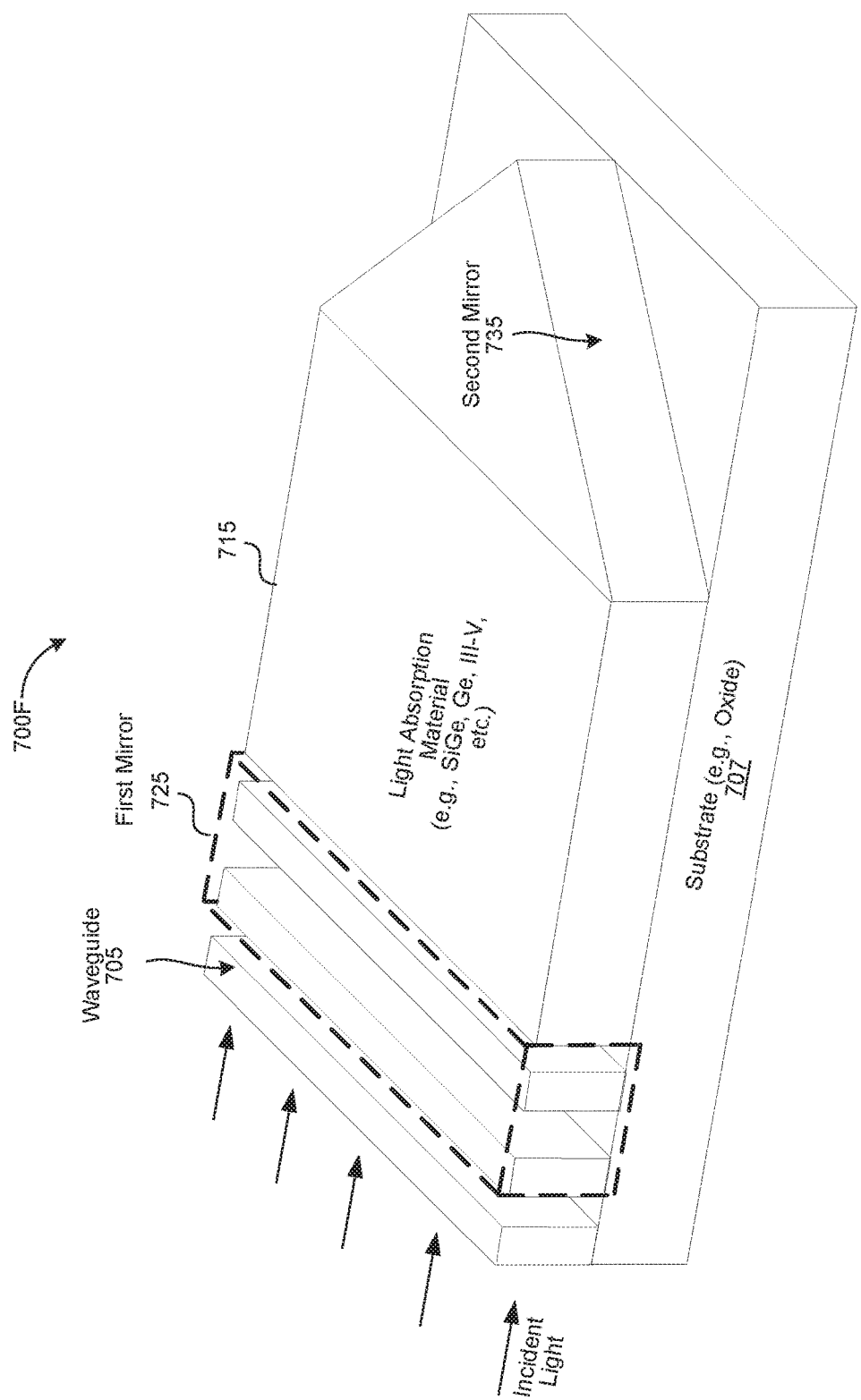

FIG. 7F illustrates a perspective view of an example implementation of a butt-coupling photodetector 700F. The second mirror 735 includes a corner mirror that is made of a different material than the light absorption region 715. As shown in FIG. 7F, the first mirror 725 is implemented using a tapered DBR structure.

Figure 7G:
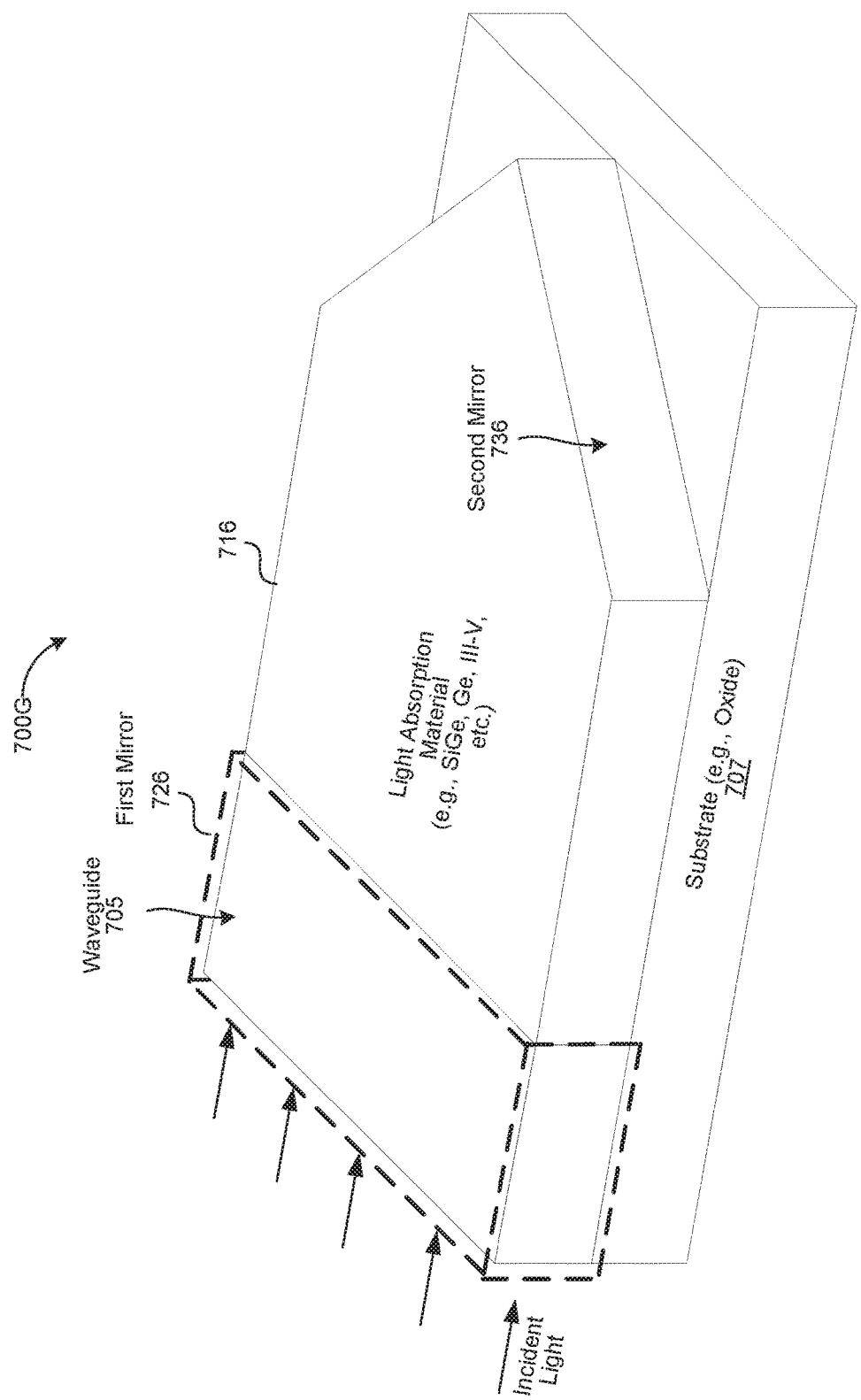

FIG. 7G illustrates a perspective view of an example implementation of a butt-coupling photodetector 700G. As shown in FIG. 7G, the structure of the photodetector 700G is designed such that the interface between the waveguide 705 and the light absorption region 716 essentially doubles as the first mirror 726; that is to say, the same component functions both as the waveguide 705 as well as the first mirror 726.

Figure 7H:
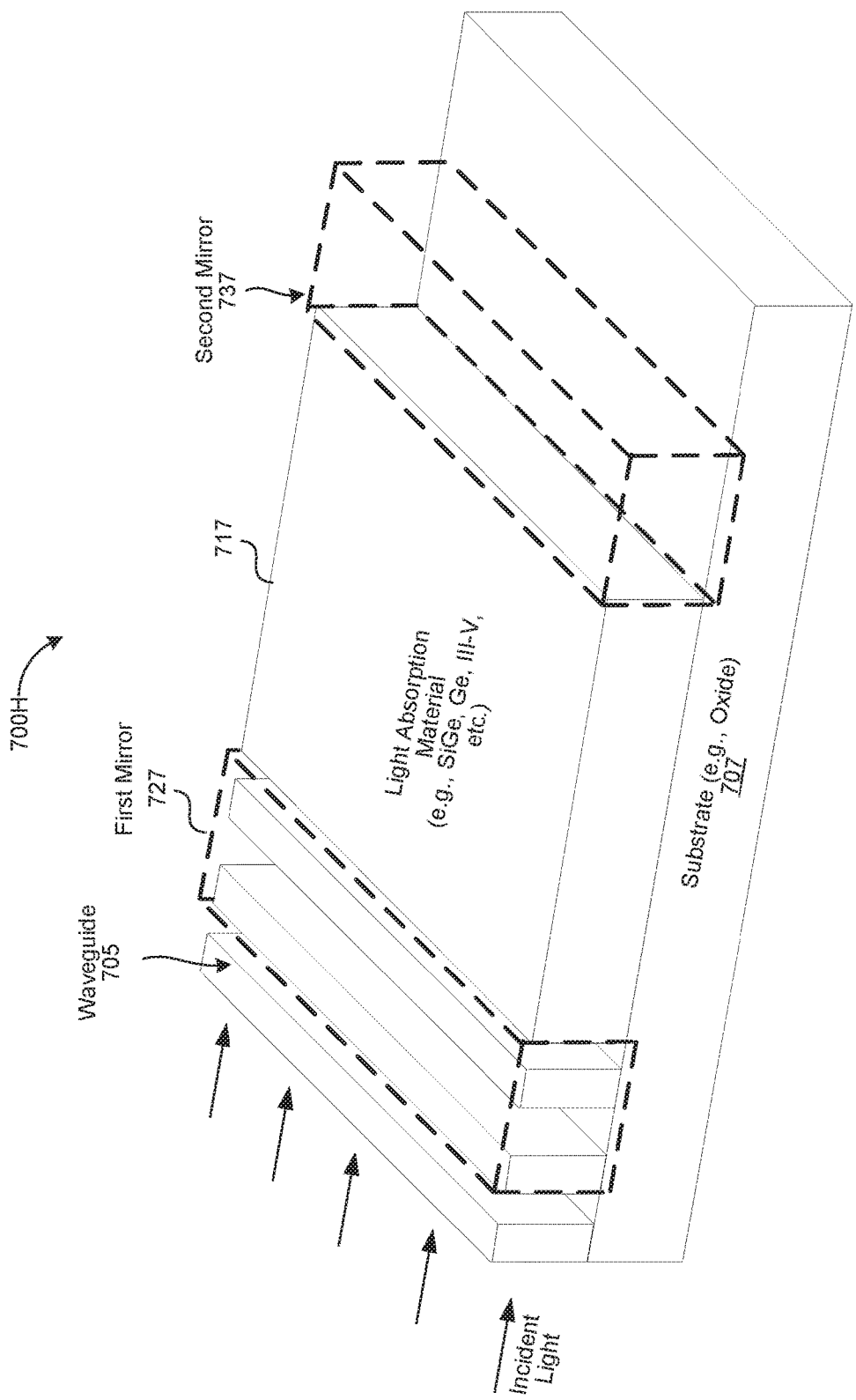

FIG. 7H illustrates a perspective view of an example implementation of a butt-coupling photodetector 700H. As shown in FIG. 7H, the structure of the photodetector 700H is designed such that an end of the light absorption region 717 that is distal from the first mirror 727 essentially functions as the second mirror 737; that is to say, the reflectivity resulting from the difference of materials between the light absorption region 717 and whatever material (which can also be void, such as depicted in FIG. 7H) being disposed at the distal end of the light absorption region 717 (i.e., where the second mirror 737 is depicted) can make the distal end of the light absorption material 717 function as the second mirror 737. As shown in FIG. 7H, the first mirror 727 is implemented using a tapered DBR structure.

In the above described manner, the technique and apparatus introduced here provide a photonic lock mechanism to confine the incident light inside the light absorption region of the photodetector, thereby achieving both high responsivity and high bandwidth. The technique introduced here also helps shrink the overall size of the photodetectors.

Figure 8:
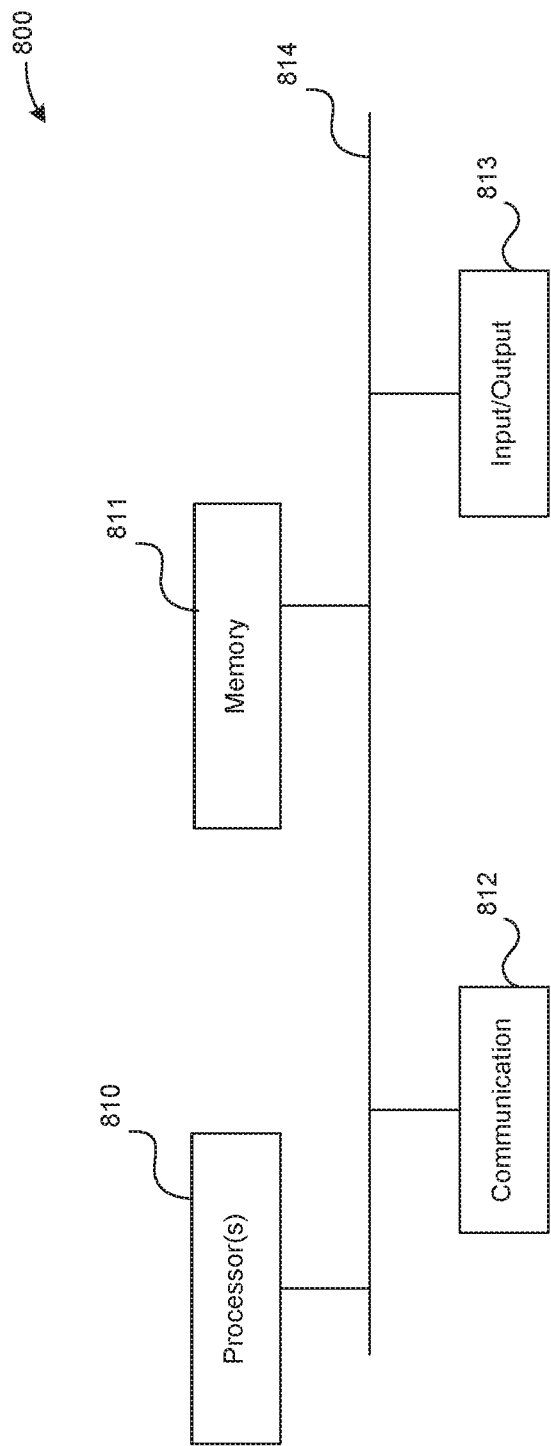
FIG. 8 illustrates a high-level block diagram showing an example of computing system in which at least some portion of the design process of FIG. 3 can be implemented or in which an embodiment of the photonic lock based photodetectors introduced here can be implemented.

FIG. 8 is a high-level block diagram showing an example of a computing device 800 that can implement at least some portion of the design process 300 of FIG. 3. Additionally or alternatively, the computing device 800 can represent an environment within which an embodiment of the photonic lock based photodetectors introduced here can be implemented.

In the illustrated embodiment, the computing system 800 includes one or more processors 810, memory 811, a communication device 812, and one or more input/output (I/O) devices 813, all coupled to each other through an interconnect 814. The interconnect 814 may be or may include one or more conductive traces, buses, point-to-point connections, controllers, adapters and/or other conventional connection devices, such as optical communication elements that may include a photonic lock based photodetector introduced here. The processor(s) 810 may be or may include, for example, one or more general-purpose programmable microprocessors, microcontrollers, application specific integrated circuits (ASICs), programmable gate arrays, or the like, or a combination of such devices. The processor(s) 810 control the overall operation of the computing device 800. Memory 811 may be or may include one or more physical storage devices, which may be in the form of random access memory (RAM), read-only memory (ROM) (which may be erasable and programmable), flash memory, miniature hard disk drive, or other suitable type of storage device, or a combination of such devices. Memory 811 may store data and instructions that configure the processor(s) 810 to execute operations in accordance with the techniques described above. The communication device 812 may be or may include, for example, an Ethernet adapter, cable modem, Wi-Fi adapter, cellular transceiver, Bluetooth transceiver, or the like. The communication device 812 may also include optical communication or optical sensing elements such as a photonic lock based photodetector. Depending on the specific nature and purpose of the processing device 800, the I/O devices 813 can include devices such as a display (which may be a touch screen display), audio speaker, keyboard, mouse or other pointing device, microphone, camera, etc. A photonic lock based photodetector introduced here may be included as (e.g., optical sensing) components in one or more of the I/O devices 813.

Unless contrary to physical possibility, it is envisioned that (i) the methods/steps described above may be performed in any sequence and/or in any combination, and that (ii) the components of respective embodiments may be combined in any manner.

The techniques introduced above can be implemented by programmable circuitry programmed/configured by software and/or firmware, or entirely by special-purpose circuitry, or by a combination of such forms. Such special-purpose circuitry (if any) can be in the form of, for example, one or more application-specific integrated circuits (ASICs), programmable logic devices (PLDs), field-programmable gate arrays (FPGAs), etc.

Software or firmware to implement the techniques introduced here may be stored on a machine-readable storage medium and may be executed by one or more general-purpose or special-purpose programmable microprocessors. A "machine-readable medium", as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible medium can include recordable/non-recordable media (e.g., read-only memory (ROM), random access memory (RAM), magnetic disk storage media, optical storage media, flash memory devices, etc.).

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A cavity-based photodetector device comprising:
a first reflective region;
a second reflective region; and
a light absorption region containing silicon and positioned between the first and second reflective regions so as to absorb light passed through the first reflective region and reflected between the first and second reflective regions,
wherein the second reflective region includes a combination of a dielectric layer and a metal coating, the dielectric layer being positioned closer to the light absorption region than the metal coating,
wherein the combination increases the second reflective region's reflectivity as compared to a reflective region without the combination, and
wherein the second reflective region's reflectivity exceeds eighty percent (80%) when a wavelength of the light is above 950 nm.

2. The device of claim 1, wherein (a) the first reflective region's reflectivity, (b) the second reflective region's reflectivity, and (c) an attenuation coefficient of the light absorption region are collectively configured such that the light resonates between the first and second reflective regions.

3. The device of claim 1, wherein the first reflective region causes a total amount of light energy that escapes from the first reflective region to be less than 10% of incident light energy.

4. The device of claim 1, wherein the first reflective region is such constructed that a reflectivity of the first reflective region is substantially equal to a one-circulation attenuation coefficient of the light absorption region, and wherein the one-circulation attenuation coefficient indicates a ratio of remainder light energy over entrance light energy in one circulation.

5. The device of claim 1, wherein the first reflective region's reflectivity is less than a reflectivity of the second reflective region.

6. The device of claim 1, further comprising:
a waveguide configured to pass the light through the first reflective region into the light absorption region.

7. The device of claim 1, wherein the light absorption region comprises a light absorption material that is disposed on substantially the same planar surface as the first and second reflective regions.

8. The device of claim 1, wherein the light absorption region comprises (a) a cavity layer disposed on substantially the same planar surface as the first and second reflective regions, and (b) a light absorption layer that is disposed over the cavity layer,
wherein the light absorption layer and the cavity layer are of different materials.

9. The device of claim 1, wherein the first reflective region is disposed over the light absorption region, and wherein the light absorption region is disposed over the second reflective region.

10. The device of claim 1, wherein the light absorption region comprises a photodiode or an avalanche photodiode layered structure.

11. The device of claim 1, wherein the first and second reflective regions are selected from a group including: a distributed Bragg reflector (DBR), a metallic reflector, a corner mirror, and a reflection trench.

12. The device of claim 1, wherein the light absorption region comprises a Group III-V compound, germanium, or a combination thereof.

13. The device of claim 1, wherein the first reflective region is configured to cause a destructive interference upon light escaping from the first reflective region so as to reduce an amount of light that escapes from the first reflective region.

14. The device of claim 1, wherein the first reflective region includes a layer of: oxide or nitride or any combination thereof.

15. The device of claim 1, wherein the first reflective region includes a combination of a silicon layer and a dielectric layer, the silicon layer being positioned closer to the light absorption region than the dielectric layer.

16. The device of claim 15, wherein the dielectric layer of the first reflective region is oxide.

17. The device of claim 1, wherein the device is a resonant-cavity-enhanced photodetector.

18. The device of claim 1, wherein the combination causes the second reflective region's reflectivity to exceed ninety percent (90%).

19. The device of claim 1, wherein the increased reflectivity of the second reflective region increases responsivity of the device as compared to a device without the combination.

20. A cavity-based photodetector device comprising:

a first reflective region;

a second reflective region; and a light absorption region containing silicon and positioned between the first and second reflective regions so as to absorb light passed through the first reflective region and reflected between the first and second reflective regions, wherein the second reflective region includes a combination of a dielectric layer and a metal coating, the dielectric layer being positioned closer to the light absorption region than the metal coating, wherein the combination causes the second reflective region's reflectivity to exceed ninety percent (90%), and wherein the second reflective region's reflectivity exceeds eighty percent (80%) when a wavelength of the light is above 950 nm.

* * * * *